(12) United States Patent
Chuang et al.

(10) Patent No.: US 9,082,630 B2
(45) Date of Patent: Jul. 14, 2015

(54) SEMICONDUCTOR DEVICE AND FABRICATING METHOD THEREOF

(71) Applicant: TAIWAN SEMICONDUCTOR MANUFACTURING CO., LTD., Hsinchu (TW)

(72) Inventors: Harry Hak-Lay Chuang, Singapore (SG); Wei-Cheng Wu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 10 days.

(21) Appl. No.: 14/075,617

(22) Filed: Nov. 8, 2013

(65) Prior Publication Data
US 2015/0129969 A1 May 14, 2015

(51) Int. Cl.
*H01L 29/00* (2006.01)
*H01L 27/06* (2006.01)
*H01L 21/8234* (2006.01)
*H01L 27/105* (2006.01)

(52) U.S. Cl.
CPC .... *H01L 27/0617* (2013.01); *H01L 21/823437* (2013.01); *H01L 21/823462* (2013.01); *H01L 27/1052* (2013.01)

(58) Field of Classification Search
CPC ............. H01L 27/10894; H01L 27/1116; H01L 27/11286; H01L 27/1052; H01L 27/11575; H01L 27/11548; H01L 27/11573; H01L 27/11531; H01L 27/11512
USPC .......................... 257/272–275, 368–370, 250
See application file for complete search history.

(56) References Cited

U.S. PATENT DOCUMENTS

| | | | |
|---|---|---|---|
| 6,674,111 B2 * | 1/2004 | Nakabayashi | 257/296 |
| 6,699,746 B2 * | 3/2004 | Chung et al. | 438/239 |
| 6,930,000 B2 * | 8/2005 | Kasuya | 438/258 |
| 8,525,270 B2 * | 9/2013 | Teo et al. | 257/369 |
| 2011/0076829 A1 * | 3/2011 | Kim et al. | 438/396 |
| 2011/0095348 A1 * | 4/2011 | Chakihara et al. | 257/298 |
| 2012/0256263 A1 * | 10/2012 | Inoue et al. | 257/368 |

* cited by examiner

*Primary Examiner* — Matthew W Such
*Assistant Examiner* — Ali Naraghi
(74) *Attorney, Agent, or Firm* — McDermott Will & Emery LLP

(57) ABSTRACT

A semiconductor device and a method for fabricating the semiconductor device are provided in the present disclosure. The semiconductor device includes a substrate including a first area and a second area divided by a shallow trench isolation (STI) area, a first dummy structure on the STI area, a second dummy structure located on the STI area, a first semiconductor structure on the first area, and a second semiconductor structure on the second area of the substrate including a high-k dielectric layer and a metal gate layer over the high-k dielectric layer. The method for fabricating the semiconductor device is a high-k dielectric first, high-k metal gate last procedure.

20 Claims, 17 Drawing Sheets

SEMICONDUCTOR DEVICE AND FABRICATING METHOD THEREOF

BACKGROUND

Semiconductor devices with various functions may be embedded in the same integrated circuit (IC). The semiconductor devices for example include non-volatile memory (NVM), complementary metal oxide semiconductor (CMOS), and capacitor. The fabricating processes for the different semiconductor devices need to be designed and integrated. Upon the integration, the fabricating processes are able to have the different devices all together such as memory device like dynamic random access memory (DRAM), static random access memory (SRAM), magnetic RAM, or non-volatile memory, and logic circuit like p-type metal oxide semiconductor (PMOS), n-type metal oxide semiconductor (NMOS), and COMS. The semiconductor devices with different material also need to be considered in the integration of the fabricating process.

Flash NVM is commonly embedded in a system on chip (SOC) integrated circuits having CMOS logic circuit. The integration of the split-gate thin film flash memory with poly-silicon gate electrode and the COMS logic circuit having high-k dielectric and metal gate on the same integrated circuit may require many additional process steps. The traditional integration process having memory device without high-k dielectric and logic device with high-k metal gate (HKMG) structure starts from forming the memory device, than depositing high-k dielectric and forming the logic device. Such process may have high-k dielectric residue, and thus requires additional masks to solve the problem which however results in contamination problems.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

As used herein, the terms "comprising," "including," "having," "containing," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1:
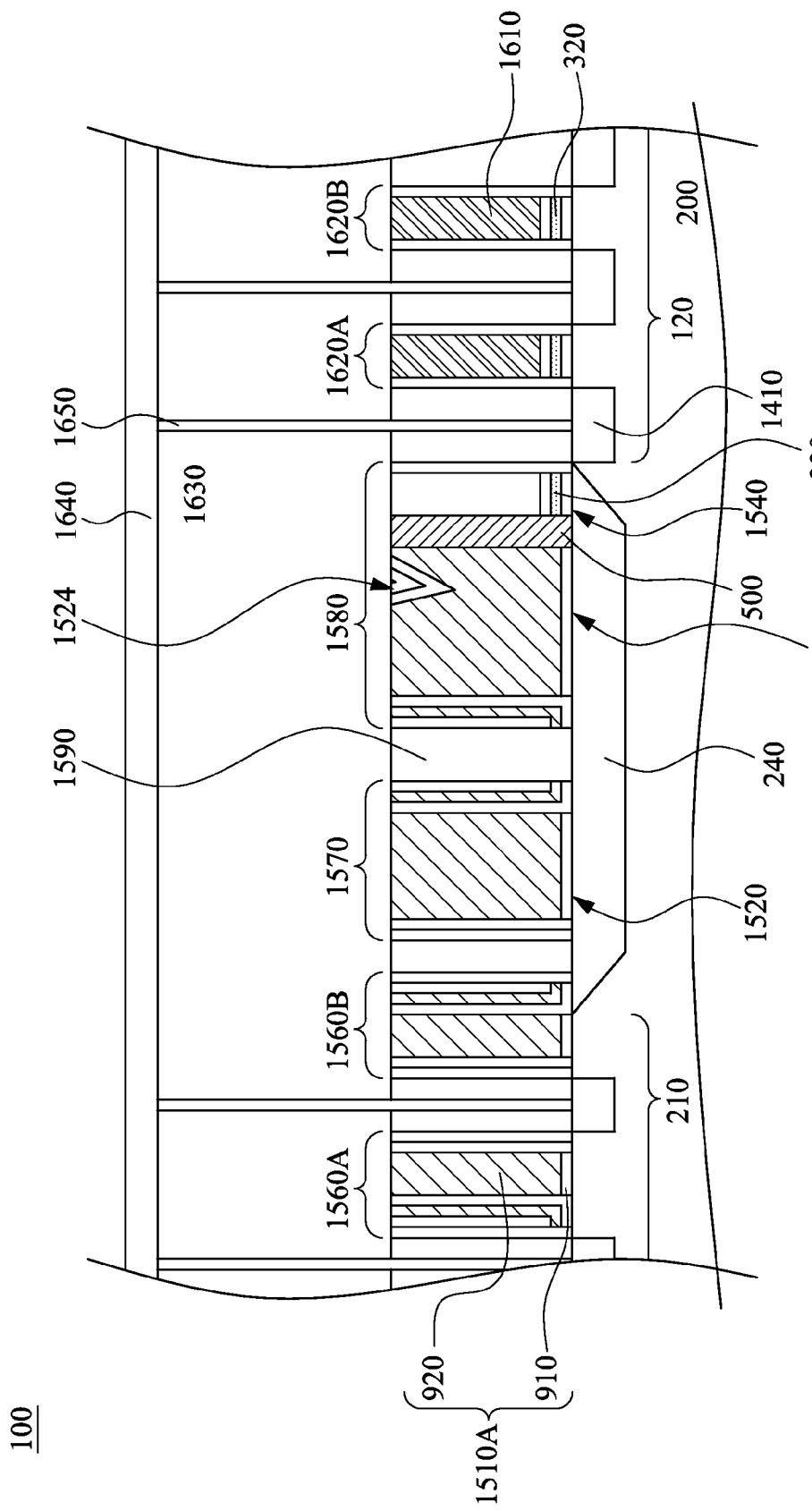
FIG. 1 is a cross-sectional view of a semiconductor device according to one embodiment of the present disclosure.

FIG. 1 is a cross-sectional view of a semiconductor device according to various embodiments of the present disclosure. The semiconductor device 100 includes a substrate 200, a first dummy structure 1570, a second dummy structure 1580, a first semiconductor structure 1560, which includes 1560A and 1560B, and a second semiconductor structure 1620, which includes 1620A and 1620B. The substrate 200 has a first area 110 and a second area 120 divided by a shallow trench isolation (STI) area 240. The substrate 200 also includes various doped regions such as n-wells and p-wells. The first dummy structure 1570 located on the STI area 240 at the side of the first area 110 and the second dummy structure 1580 located on the STI area 240 at the side of the second area 120. The first semiconductor structure 1560 disposed on the first area 110 of the substrate 200. The second semiconductor structure 1620 disposed on the second area 120 of the substrate 200. The first semiconductor structure 1560 and the second semiconductor structure 1620 are devices formed as a part of the semiconductor device 100. For example, the semiconductor device 100 can include flash memory and/or other logic circuits, active devices as P-channel field effect transistors (pFET), N-channel FET (nFET), metal-oxide semiconductor field effect transistors (MOSFET), complementary metal-oxide semiconductor (CMOS) transistors, bipolar junction transistors (BJT), high voltage transistors, high frequency transistors, other memory cells, and passive components such as resistors, capacitors, and inductors, or combinations thereof.

In various embodiments of the present disclosure, the first semiconductor structure 1560 is a memory device such as a dynamic random access memory (DRAM), a static random access memory (SRAM), a magnetic RAM, a non-volatile memory, or combinations thereof, and the second semiconductor structure 1620 is a logic device such as a p-type metal oxide semiconductor (PMOS), a n-type metal oxide semiconductor (NMOS), a complementary metal-oxide-semiconductor (COMS), or combinations thereof. In various embodiments of the present disclosure, the first semiconductor structure 1560 includes a second intermediate layer 910 and a second conductive layer 920 over the second intermediate layer 910, the second conductive layer 920 includes polysilicon, and the second semiconductor structure 1620 includes the high-k dielectric layer 320 and a metal gate layer 1610 over the high-k dielectric layer 320. In various embodiments of the present disclosure, the first semiconductor structure 1560 is a thin film split-gate flash memory, and the second semiconductor structure 1620 is a COMS includes high-k metal gate (HKMG) structure.

The first dummy structure 1570 and the second dummy structure 1580 are residual structures during the high-k dielectric layer first, HKMG device last process in an embedded system as a dummy guard ring to separate and protect the first and second semiconductor structures 1560,1620 in different area, respectively. The corresponding elements of such as the first dummy structure 1570 and the second dummy structure 1580 are referred to FIGS. 15 and 16. In various embodiments of the present disclosure, the first dummy structure 1570 includes a first dummy gate stack 1520, a second dielectric layer at one side of the first dummy gate stack 1520, a storage structure at the other side of the first dummy gate stack 1520, and a third spacer next to the second dielectric layer. The first dummy gate stack 1520 includes a second intermediate layer 910 and a second conductive layer 920 over the second intermediate layer 910. The storage structure includes a storage layer having a L-shape over the substrate, a third conductive layer having a L-shape over the storage layer, and a third protective layer over the third conductive layer. The storage layer includes a nano dot storage layer and two oxide layers sandwiches the nano dot storage layer (in which the sandwich structure only represented as one storage layer in the figure).

In various embodiments of the present disclosure, the second dummy structure 1580 includes a second dummy gate stack 1540 with a high-k dielectric layer 320 and a first spacer 500 next to the second dummy gate stack, a third dummy gate stack 1522 next to the first spacer 500, a storage structure next to the third dummy gate stack 1522, and a third spacer next to the second dummy gate stack. The second dummy gate stack 1540 includes a first intermediate layer over the substrate 200, a high-k dielectric layer 320 over the first intermediate layer, an etch stop layer over the high-k dielectric layer 320, and a first conductive layer over the etch stop layer. The third dummy gate stack 1522 includes a second intermediate layer overlying the substrate 200, a second conductive layer over the a second intermediate layer, comprising a trench on a upper surface of the second conductive layer, and a trench stack 1524 filling the trench of the second conductive layer to flat the upper surface of the second conductive layer. The width of the dummy structures is about 0.2-0.6 μm.

In various embodiments of the present disclosure, the first semiconductor structure 1560 includes a first gate structure 1510, a storage structure next to the first gate structure 1510, and a second dielectric layer on the sidewall at the other side of the first gate structure 1510, two third spacers next to the storage structure and the second dielectric layer separately. The first gate structure 1510 includes a second intermediate layer 910 over the substrate 200, and a second conductive layer 920 over the second intermediate layer 910.

In various embodiments of the present disclosure, the second semiconductor structure 1620 includes a first intermediate layer over the substrate 200, a high-k dielectric layer 320 over the first intermediate layer, an etch stop layer over the high-k dielectric layer 320, a metal gate layer 1610 over the etch stop layer, and two third spacers on the substrate 200 next to the metal gate layer 1610.

In various embodiments of the present disclosure, the first and second semiconductor structures 1560,1620 further include doped regions 1410 including lightly and heavily doped region as source/drain region. In various embodiments of the present disclosure, the semiconductor device further includes a first interlayer dielectric layer 1590 on the substrate 200 and between the first and second semiconductor structures 1560,1620 and the first and second dummy structures 1570,1580, a second interlayer dielectric layer 1630 overlying the first interlayer dielectric layer 1590, the first and second semiconductor structures 1560,1620 and the first and second dummy structures 1570,1580, a metal layer 1640 overlying the second dielectric layer 1630, a plurality of contacts 1650 connecting the doped regions 1410 and the metal layer 1640.

Figure 2:
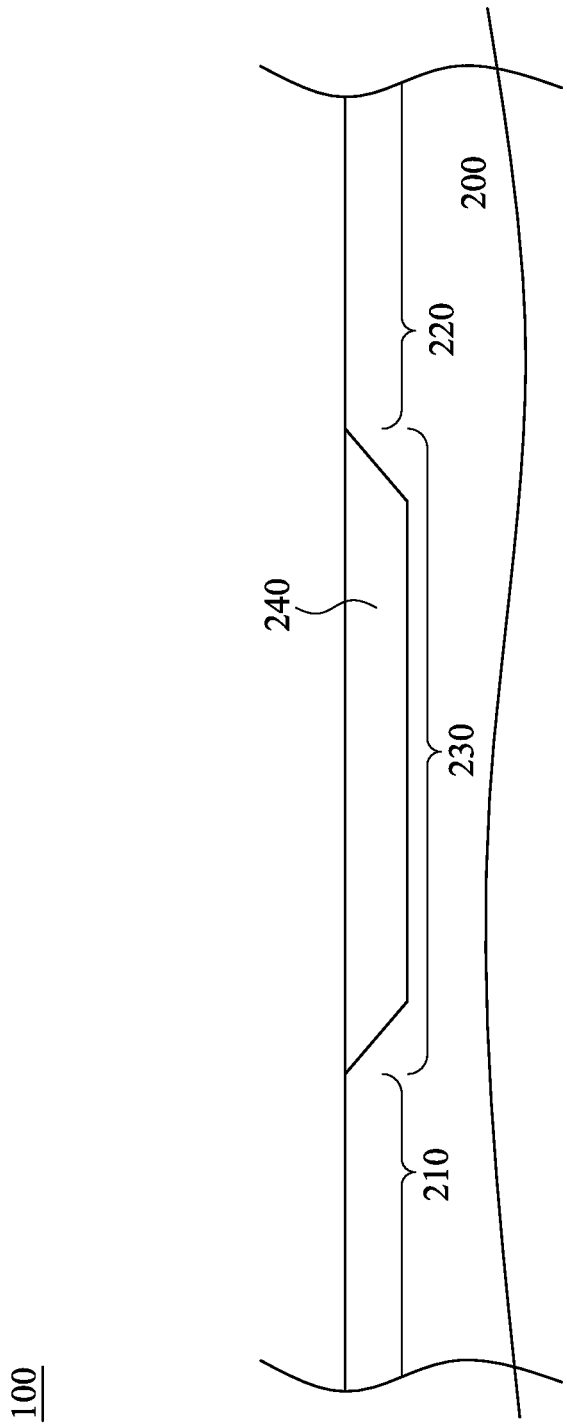
FIGS. 2-16 are cross-sectional views at various stages of manufacturing a semiconductor device according to one embodiment of the present disclosure.

FIGS. 2-16 are cross-sectional views at various stages of fabricating a semiconductor device 100 according to various embodiments of the present disclosure. Referring to FIG. 2, a substrate 200 is provided. The substrate 200 includes a semiconductor material like silicon, germanium, carbon, another semiconductor material as an III-V or II-VI material, or combinations thereof. The substrate 200 includes a shallow trench isolation (STI) area 240, dividing the substrate 200 into three regions including a first active region 210, a dummy region 230, and a second active region 220 which are sequently adjacent to each other, and the area of the dummy region 230 is the same as the STI area 240. The STI area 240 is formed by conventional photolithographic and etching procedures, for example, reactive ion etching (RIE), followed by deposition method like low pressure chemical vapor deposition (LPCVD) or plasma enhanced chemical vapor deposition (PECVD) to fill the shallow trenches by materials includes silicon oxide, silicon nitride, silicon oxynitride, fluoride-doped silicate glass (FSG), low-k dielectric material, or combinations thereof.

Figure 3:
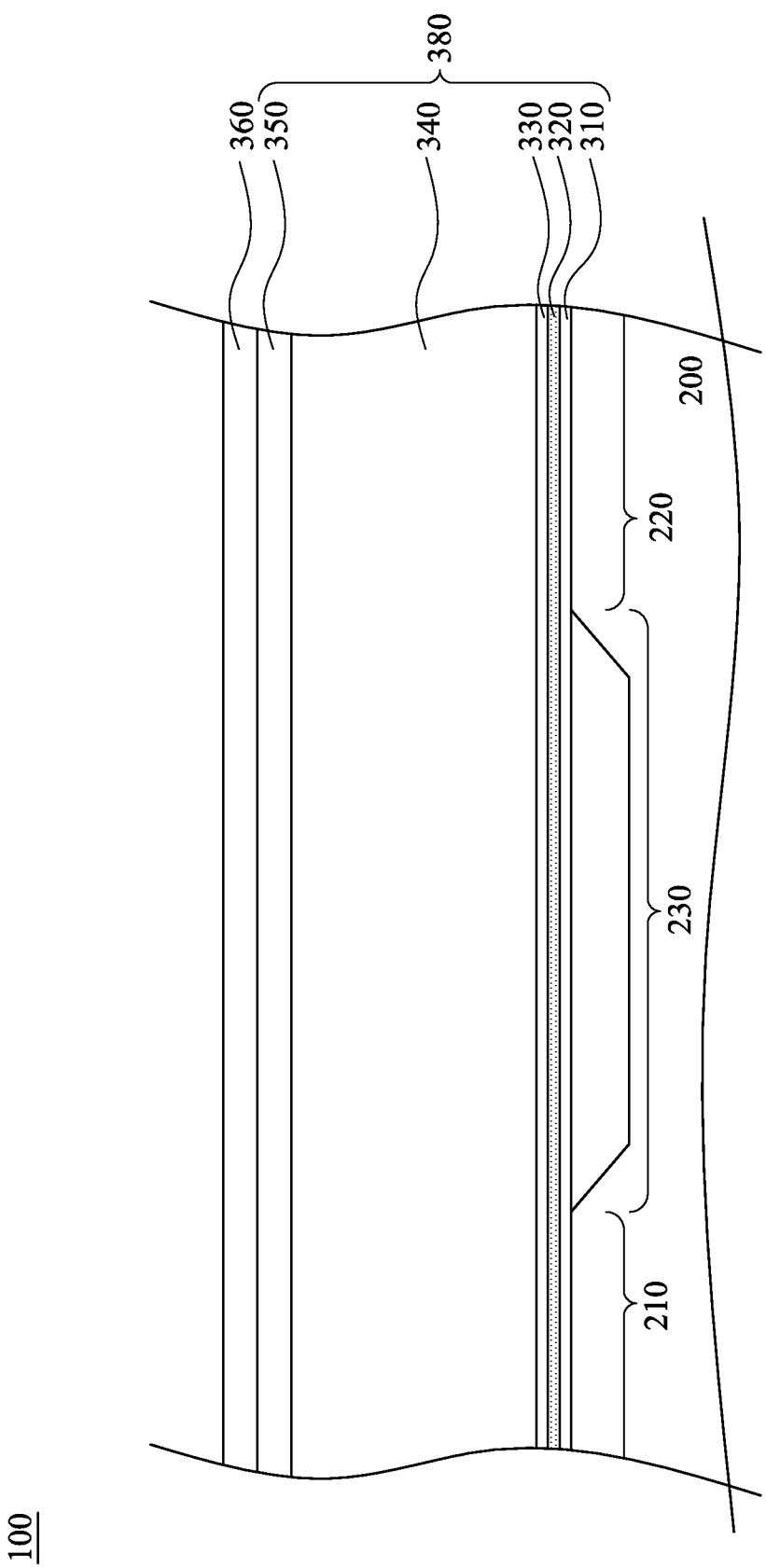

In FIG. 3, a high-k stack 380 and a first dielectric layer 360 are deposited over the entire substrate 200 include the first active region 210, the dummy region 230, and the second active region 220. The high-k stack 380 includes a first intermediate layer 310 overlying the substrate 200, a high-k dielectric layer 320 overlying the first intermediate layer 310, an etch stop layer 330 overlying the high-k dielectric layer 320, a first conductive layer 340 overlying the etch stop layer 330, a first protective layer 350 overlying the first conductive layer 340. The first dielectric layer 360 is disposed over the first protective layer 350. The layers are disposed by conventional deposition method including LPCVD, PECVD, atomic layer deposition (ALD), spin-on, sputtering or other suitable methods. In various embodiments of the present disclosure, the first intermediate layer 310 includes silicon oxide, silicon oxynitride, or a low k material. The high-k dielectric layer 320 includes high-k materials as hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The etch stop layer 330 includes Titanium nitride (TiN). The first conductive layer 340 includes non-doped polysilicon. The first protective layer 350 includes silicon nitride layer (SiN) as a hard mask. The first dielectric layer 360 includes silicon oxide. In one embodiment of present disclosure, the thickness of the etch stop layer 330 is about 20 A, the first conductive layer 340 is about 680 A, the first protective layer 350 is about 100 A and the first dielectric layer 360 is about 30 A.

Figure 4:
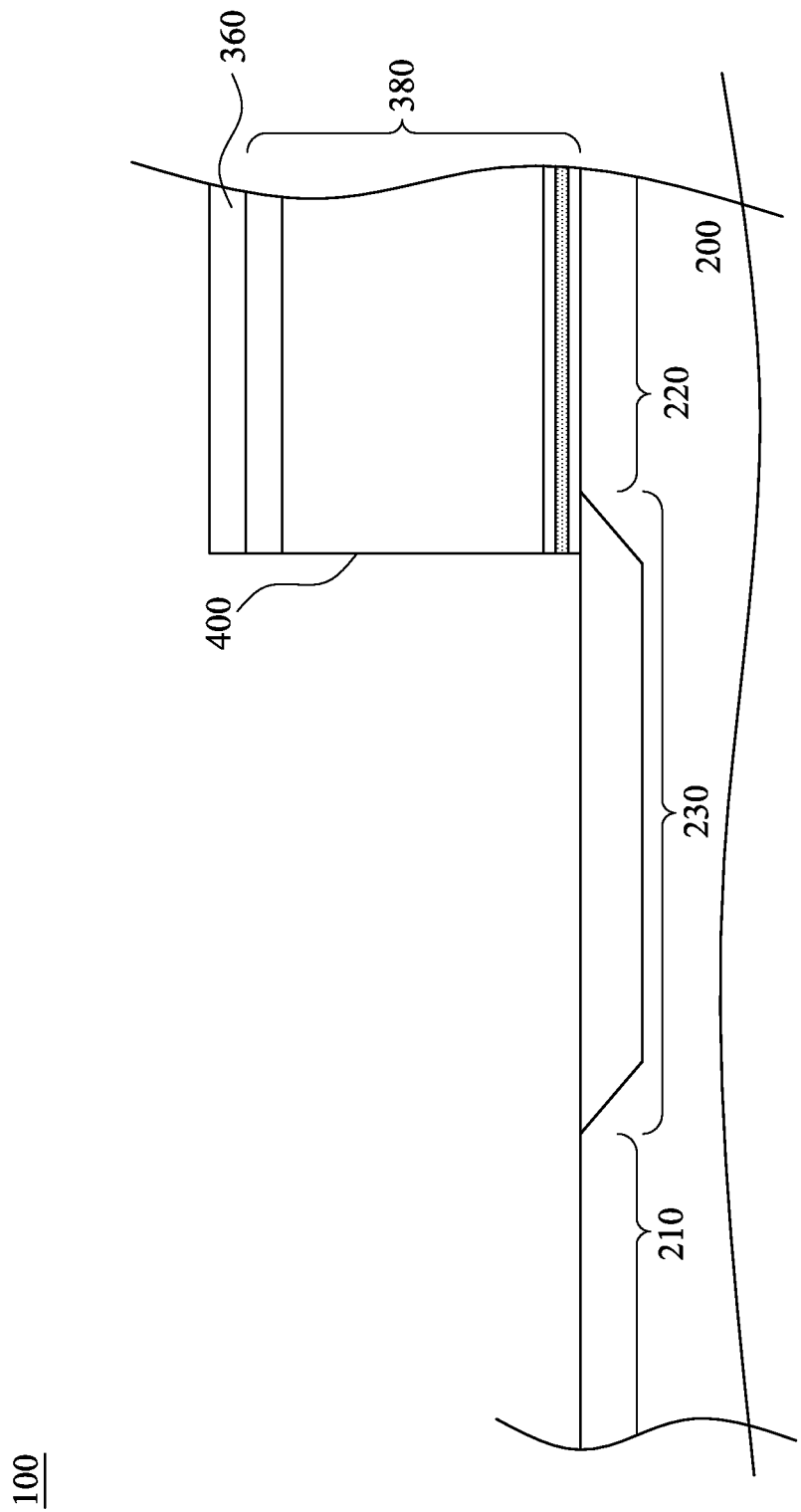

Referring to FIG. 4, the first dielectric layer 360 and the high-k stack 380 over the first active region 210 and the part of the dummy region 230 close to a boundary of the dummy region 230 and the second active region 220 of the substrate 200 had been etched away, forming a sidewall 400 of the high-k stack 380 on the dummy region 230 close to a boundary of the dummy region 230 and the second active region 220. The high-k stack 380 covers the second active region 220 for a second device formation and a part of the dummy region 230 for the second dummy structure formation. The etching process can be dry or wet etching process.

Figure 5:
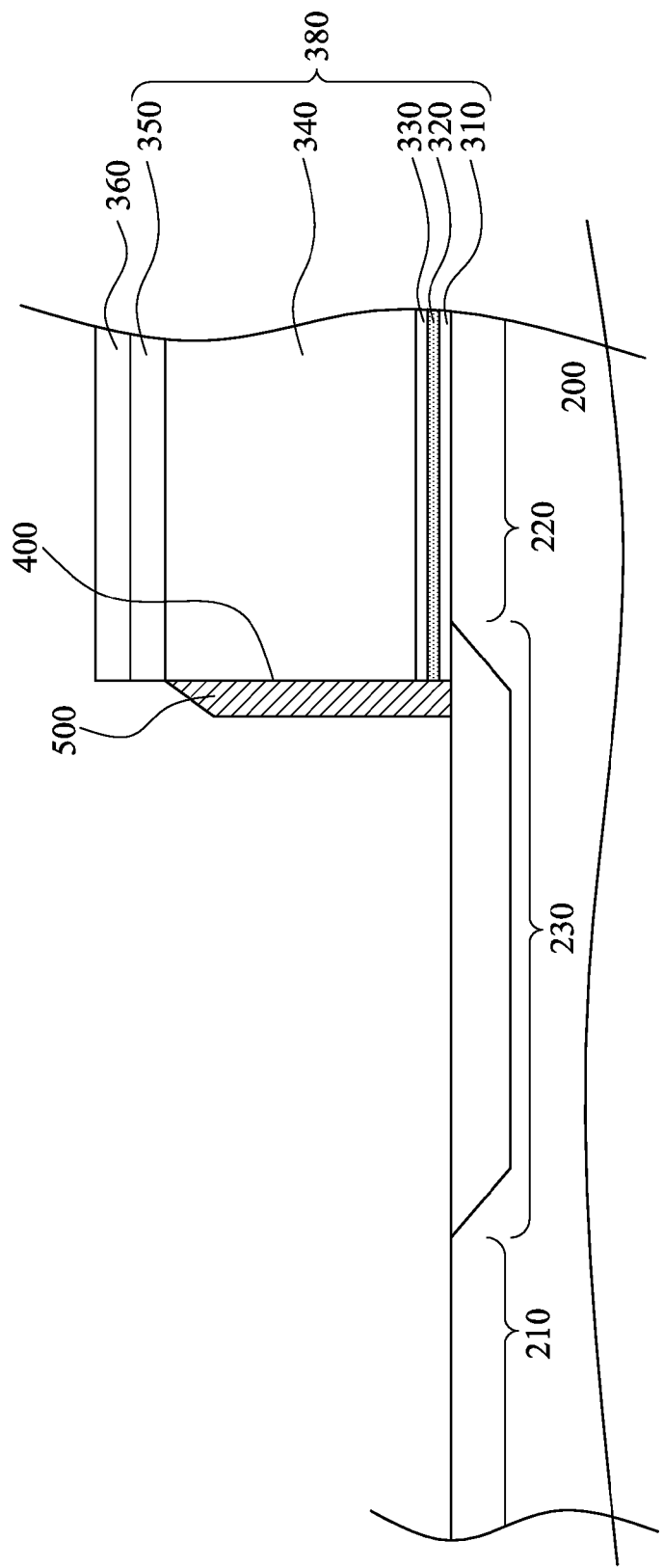

Referring to FIG. 5, a first spacer 500 is formed next to the sidewall 400 of the high-k stack 380 over the dummy region 230. The height of the first spacer 500 is between the height of the first protective layer 350 to the substrate 200 to seal and protect the first conductive layer 340 and the high-k dielectric layer 320 not to be contaminated during the formation of the first semiconductor structure. The first spacer 500 includes silicon nitride (SiN) and can form by conventional depositing process, for example, ALD or LPCVD, and etching process.

Figure 6:
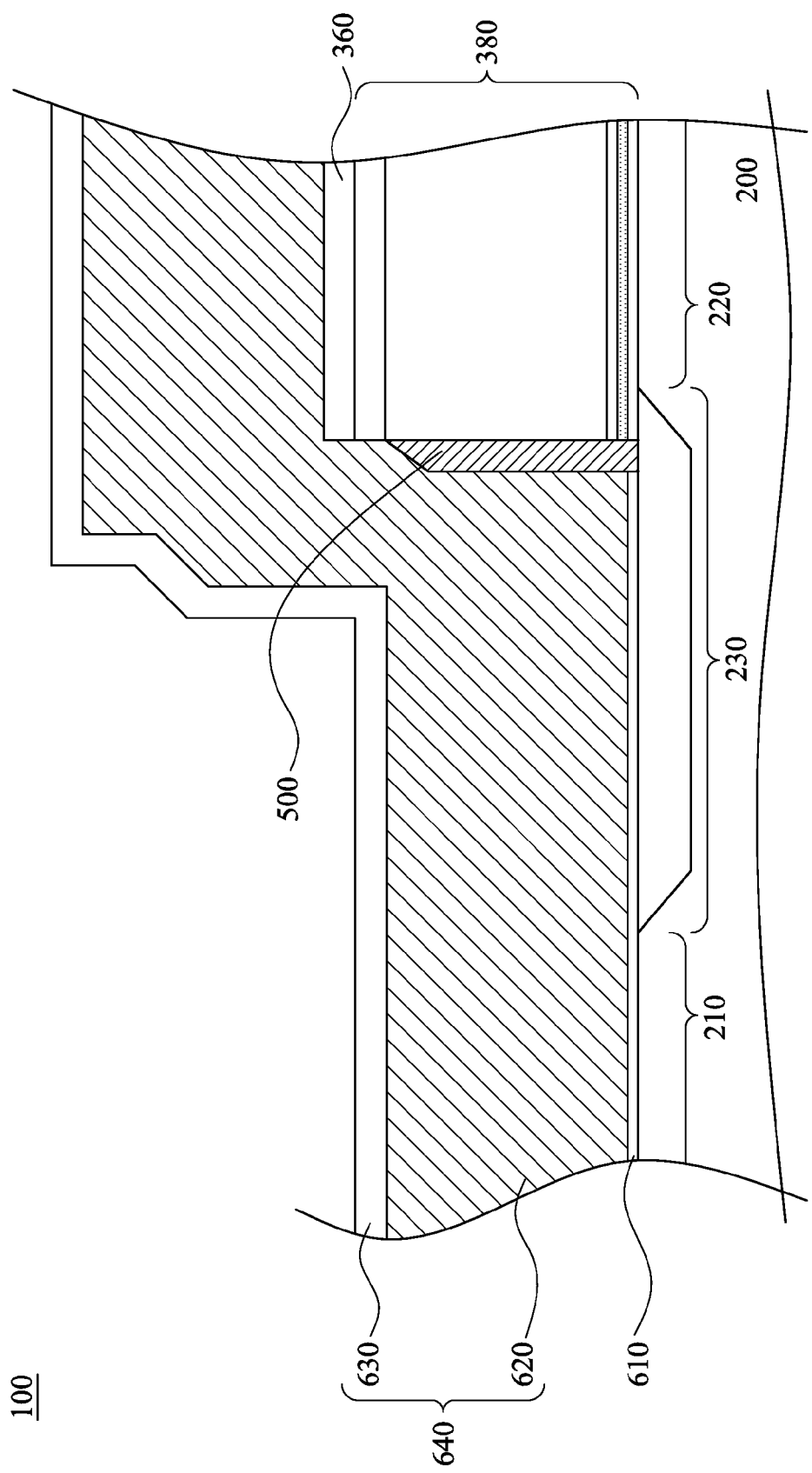

Referring to FIG. 6, a second intermediate layer 610 is deposited on the substrate 200 and a conductive gate stack 640 is deposited over the second intermediate layer 610 and first dielectric layer 360. The second intermediate layer 610 includes silicon oxide, silicon oxynitride, or a low k material and is formed by in situ steam generation (ISSG) or other suitable deposition method. The conductive gate stack 640 includes a second conductive layer 620 overlying the second intermediate layer 610, and a second protective layer 630 overlying the second conductive layer 620. The second conductive layer 620 and the second protective layer 630 can be deposited by the previously described method like LPCVD. In various embodiments of the present disclosure, the second conductive layer 620 includes doped polysilicon and the second protective layer 630 includes silicon nitride as a hard mask.

Figure 7:
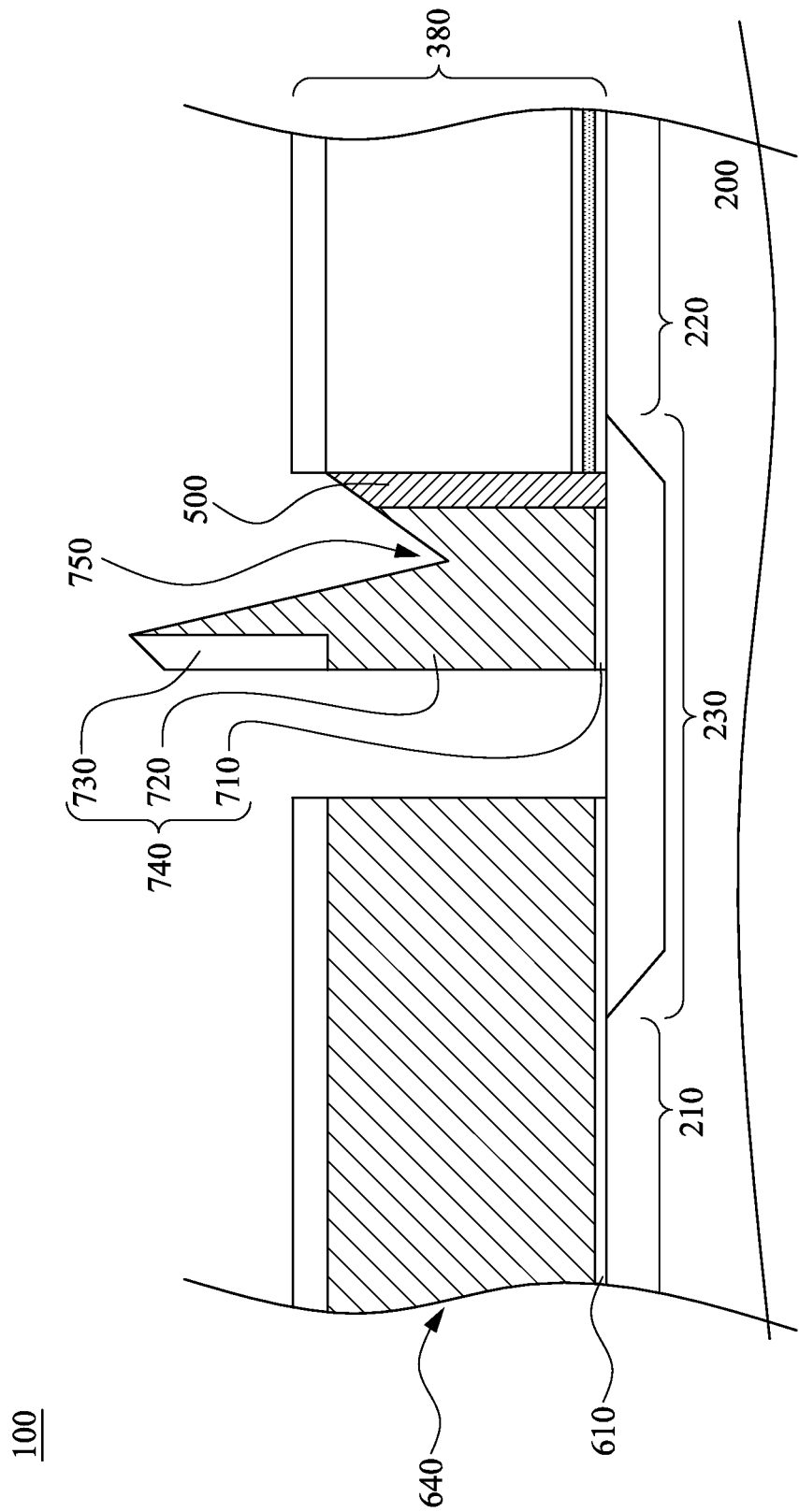

Referring to FIG. 7, the conductive gate stack 640 and the second intermediate layer 610 on part of the dummy region 230 next to the first spacer 500, and the conductive gate stack 640 and the first dielectric layer 360 on the high-k stack 380 had been etched, forming a residue gate stack 740 next to the first spacer 500. The conductive gate stack 640 and the second intermediate layer 610 cover the first active region 210 in order to form the first semiconductor structure and part of the dummy region 230 to form the first dummy structure. The high-k stack 380 covers the second active region 220 in order to form the second semiconductor structure and part of the dummy region 230 to form the second dummy structure. The etching process is an anisotropic etching to etch the conductive gate stack 640 and the second intermediate layer 610 next to the first spacer 500 to expose the substrate 200 to separate the first and the second dummy structures, and the conductive gate stack 640 and the first dielectric layer 360 to decrease the height difference between the high-k stack 380 and the conductive gate stack 640. The residue gate stack 740 next to the first spacer 500 is formed after the etching process. The residue gate stack 740 includes a second intermediate layer 710 over the substrate 200, a second conductive layer 720 over the a second intermediate layer 710 includes a trench 750 on a upper surface of the second conductive layer 720, and a first residue layer 730 mounted in the second conductive layer 720 at the side away the first spacer. The first residue layer 730 is a residue of the second protective layer 630 after the anisotropic etching process. The anisotropic etching includes dry etching, reactive ion etching (RIE), plasma etching, and other conventional isotropic etching way. In comparison with isotropic etching, anisotropic etching is simpler to operate and spend less time.

Figure 8:
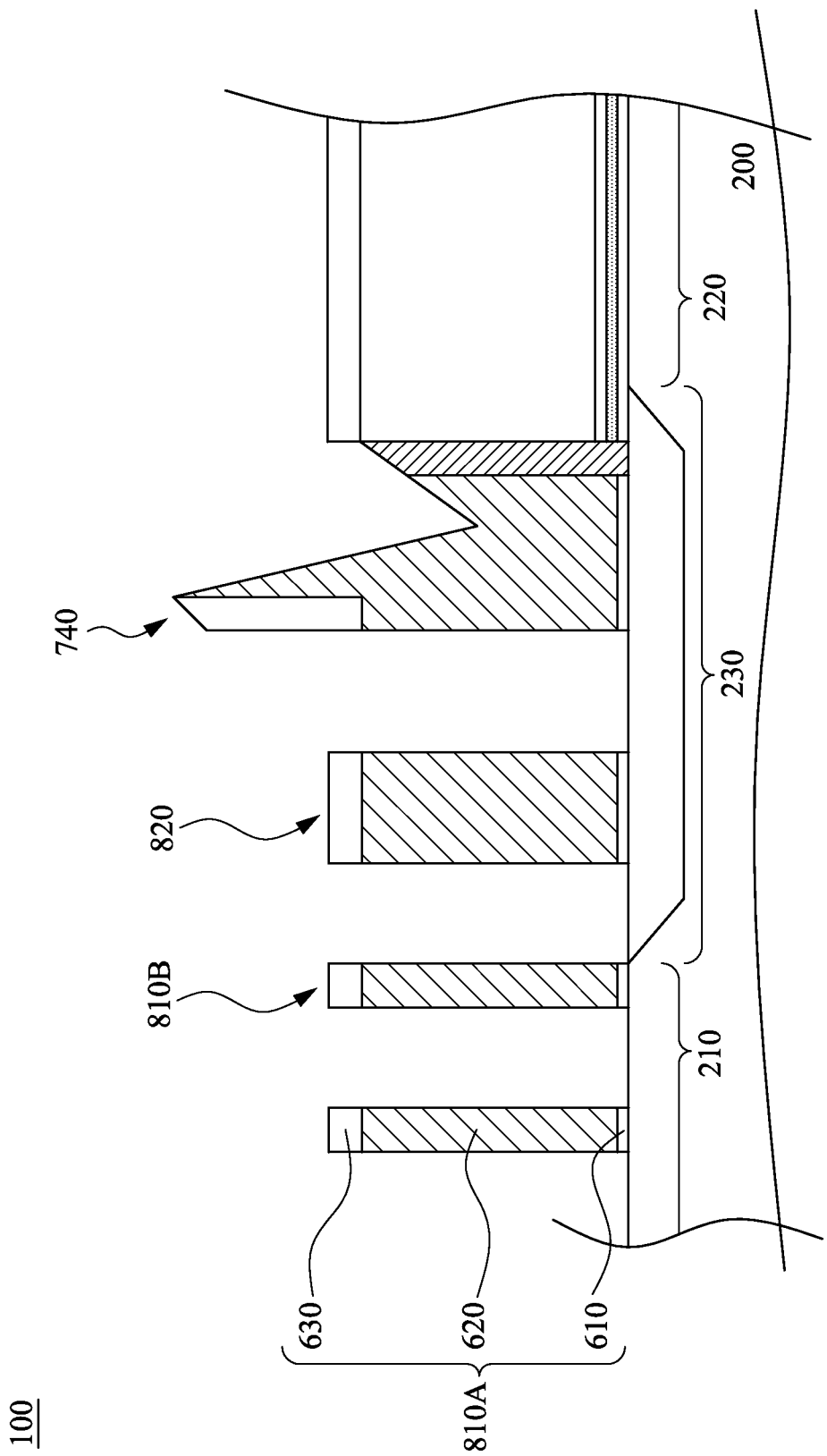

FIGS. 8-11 illustrate cross-sectional views at various stages of forming a first semiconductor structure on the first active region. Referring to FIG. 8, a first gate stack 810A, 810B is formed on the first active region 210 and a third gate stack 820 is formed on the dummy region 230. The first gate stack 810B is formed at the boundary of the first active region 210 and dummy region 230 on the first active region 210. The process of forming a first gate stack 810 on the first active region 210 and a third gate stack 820 on the dummy region 230 includes photolithography and etching as known in the art. The gate stacks 810A, 810B, 820 include the second intermediate layer 610 on the substrate, the second conductive layer 620 over the second intermediate layer 610 and the second protective layer 630 over the second conductive layer 620.

Figure 9:
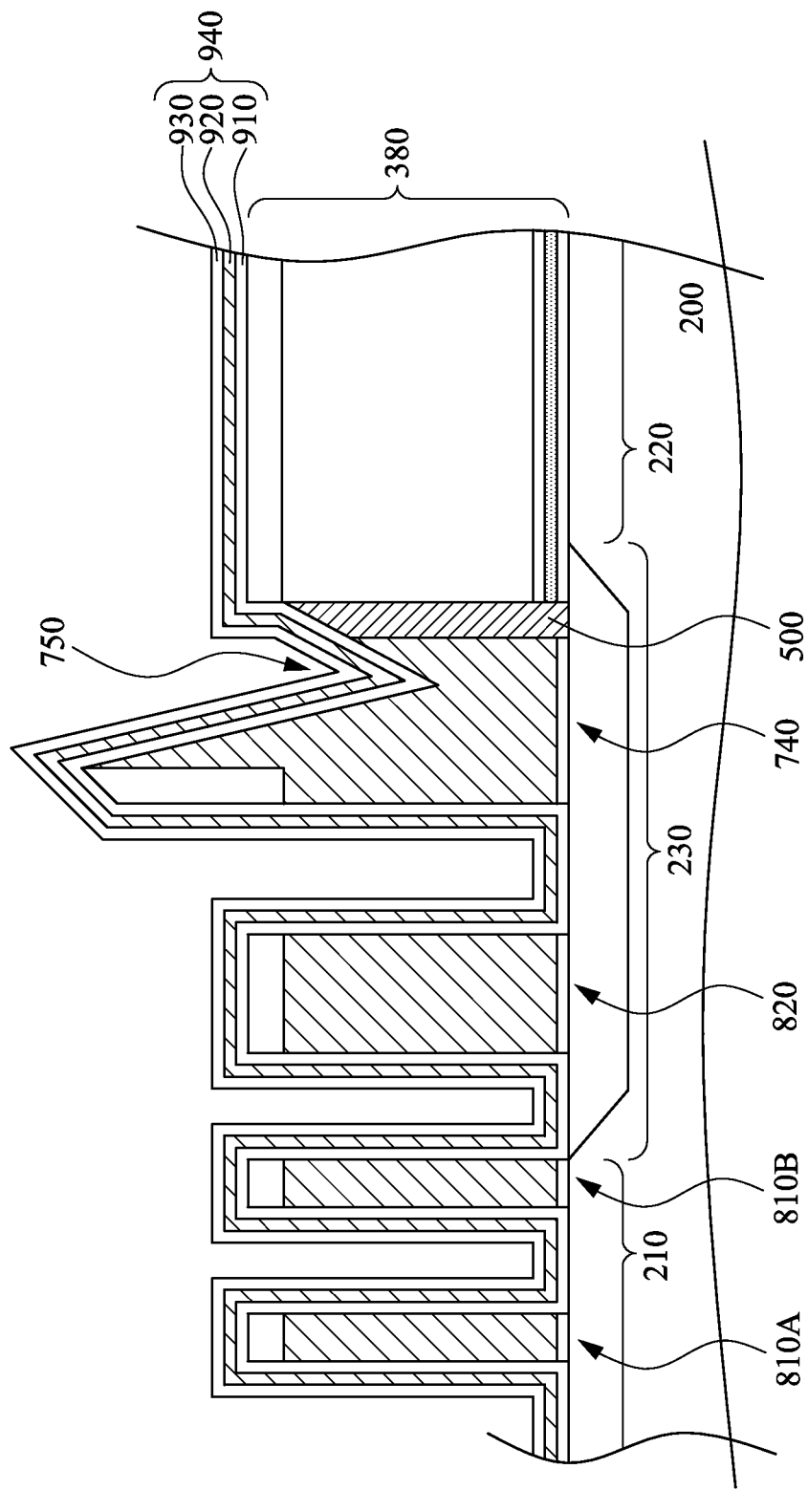

Referring to FIG. 9, a first storage stack 940 is disposed over the gate stacks 810, 820, the high-k stack 380, the first spacer 500, the residue gate stack 740, and the substrate 200. Depositing a first storage stack 940 over the entire surface of the substrate 200 includes depositing a storage layer 910 over the entire surface of the substrate 200, depositing a third conductive layer 920 over the entire storage layer 910, and depositing a third protective layer 930 over the entire third conductive layer 920. The storage layer 910 includes a nano dot storage layer and two oxide layers sandwiches the nano dot storage layer (the sandwich structure only represented as one storage layer 910 in the figure) for a split gate thin film structure, and can also include an oxide nitride oxide (ONO) stack as the storage layer 910 for NVM. In various embodiments of the present disclosure, the storage layer 910 includes silicon oxide and silicon nanocrystal dots, the third conductive layer 920 includes doped polysilicon, the third protective layer 930 includes silicon nitride as a hard mask. The first storage stack 940 can be deposit in a previously described way, in some embodiments, annealing process can be added in the depositing process.

Figure 10:
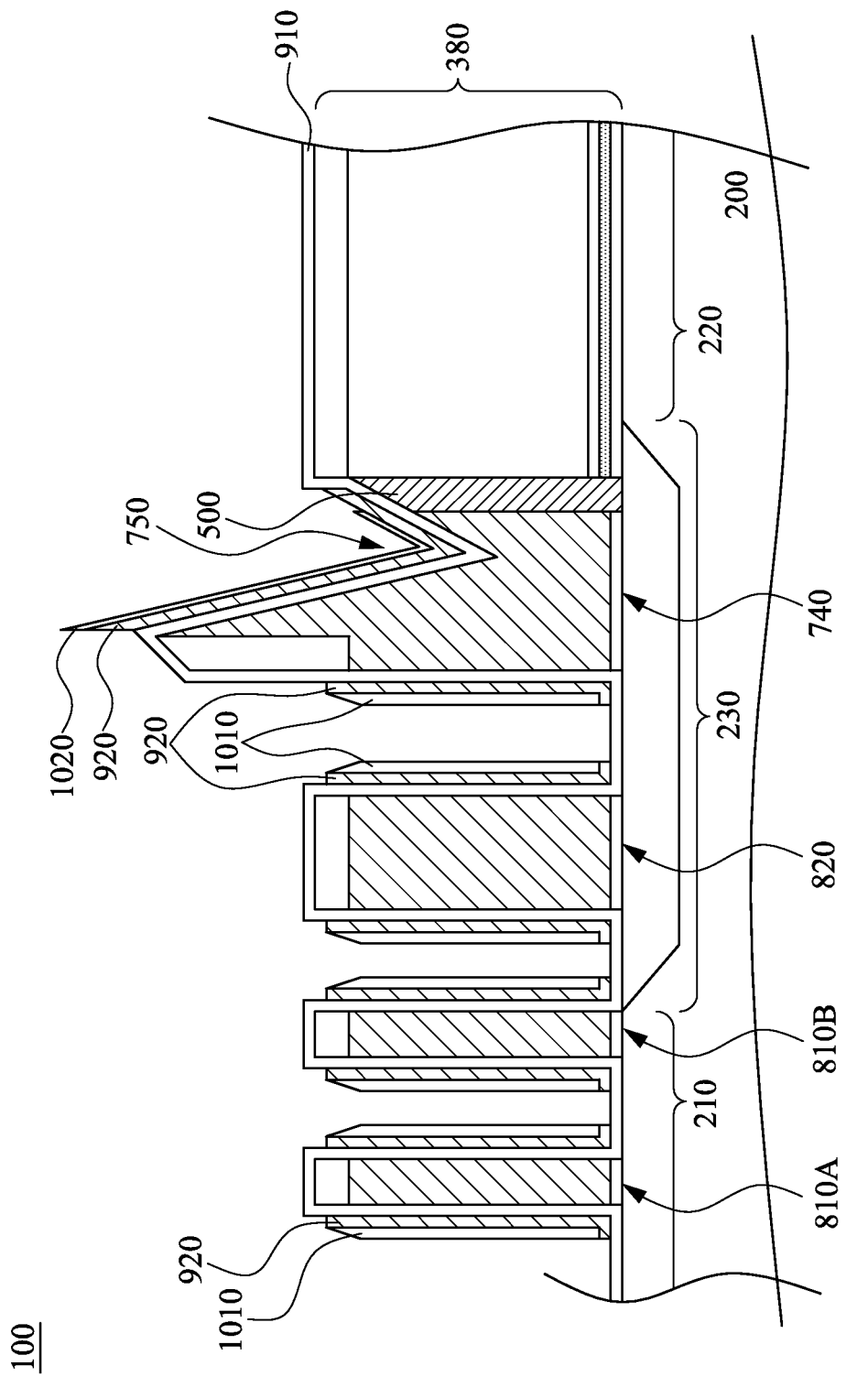

Referring to FIG. 10, a plurality of second spacers 1010 is formed next to the gate stacks 810, 820, 740. The part of the first storage stack 940, including the part of third conductive layer 920 and the third protective layer 930 on the surface of the substrate 200 and on the upper surface of the stacks 810, 820, 380, are etched to form the L-shaped third conductive layer 920 and the second spacers 1010 on the sidewalls of the gate stacks 810, 820, 740. A second residue layer 1020 is formed during the etching process. The second residue layer 1020 is a residue of the third protective layer 930 over the third conductive layer 920 on the trench 750 of the residue gate stack 740. The process of forming the second spacers 1010 includes photolithography and etching as known in the art. In one embodiment of present disclosure, a plurality seal spacers (not illustrated in the figure) including silicon nitride are formed on the sidewall of the second spacers 1010 by deposition and etching procedure to protect the conductive layer 920.

Figure 11:
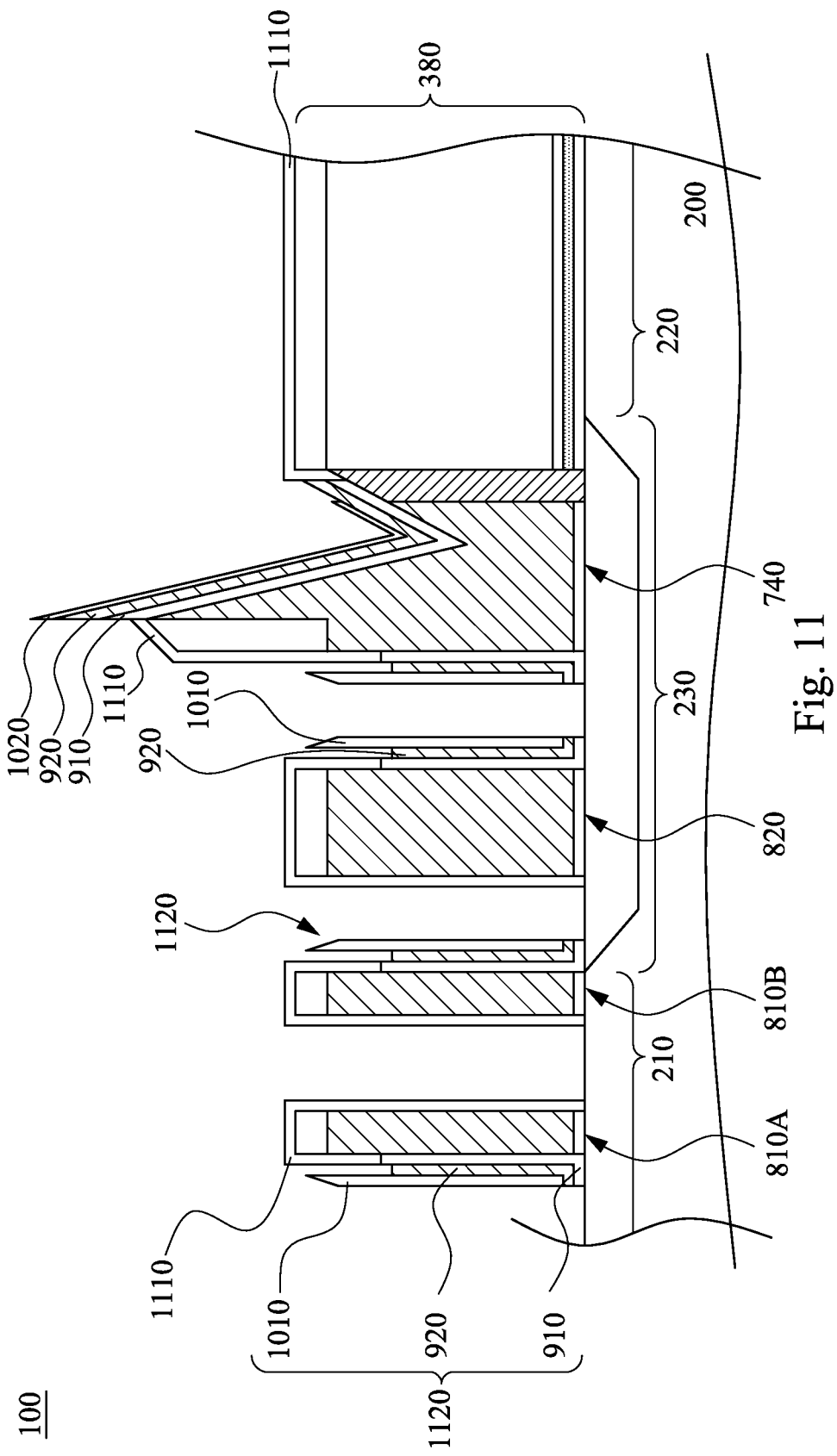

Referring to FIG. 11, a plurality of second storage stacks 1120 are formed next to one sidewall of the gate stacks 810, 820, 740. Etching part of the first storage stack 940 includes photolithography and etching to define the source/drain region, and blanket etching the storage layer 910 to form the second storage stacks 1120, and a second dielectric layer 1110 is left after the blanket etching process. The second dielectric layer 1110 includes silicon oxide. The etching process can be wet etching, dry etching, CDE, RIE, or combinations thereof. The second storage stacks 1120 includes the storage layer 910 having a L-shape over the substrate 200 and next to one sidewall of the gate stacks 810, 820, 740, the third conductive layer 920 having a L-shape over the storage layer 910, and the second spacers 1010 overlying the third conductive layer 910. The second storage stacks 1120 can be formed on either sidewall of the stacks 810, 820.

Figure 12:
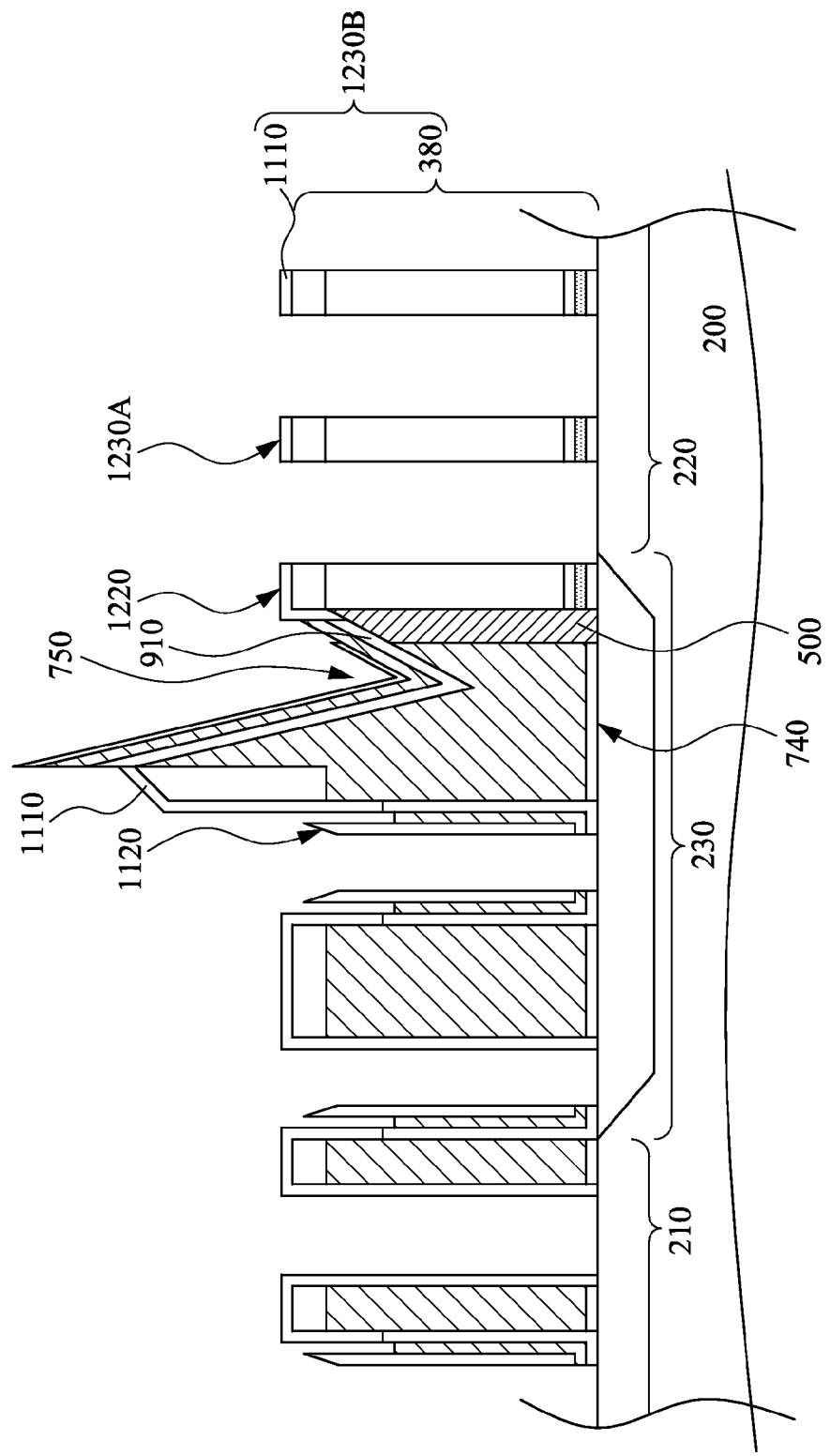

FIGS. 12-16 illustrate cross-sectional views at various stages of forming a second semiconductor structure on the second active region 220. Referring to FIG. 12, a second gate stack 1230 and a fourth gate stack 1220 are formed by etching the high-k stack 380. Etching the high-k stack 380 to form a second gate stack 1230 on the second active region 220 on the substrate 200 and a fourth gate stack 1220 on the dummy region 230 next to the second active region 220 include photolithography and etching process as known in the art to etch part of the second dielectric layer 1110 and the high-k stack 380 on the second active region 220. The second gate stack 1230 and the fourth date stack 1220 include the high-k stack 380 and the second dielectric layer 1110 overlying the high-k stack 380.

Figure 13:
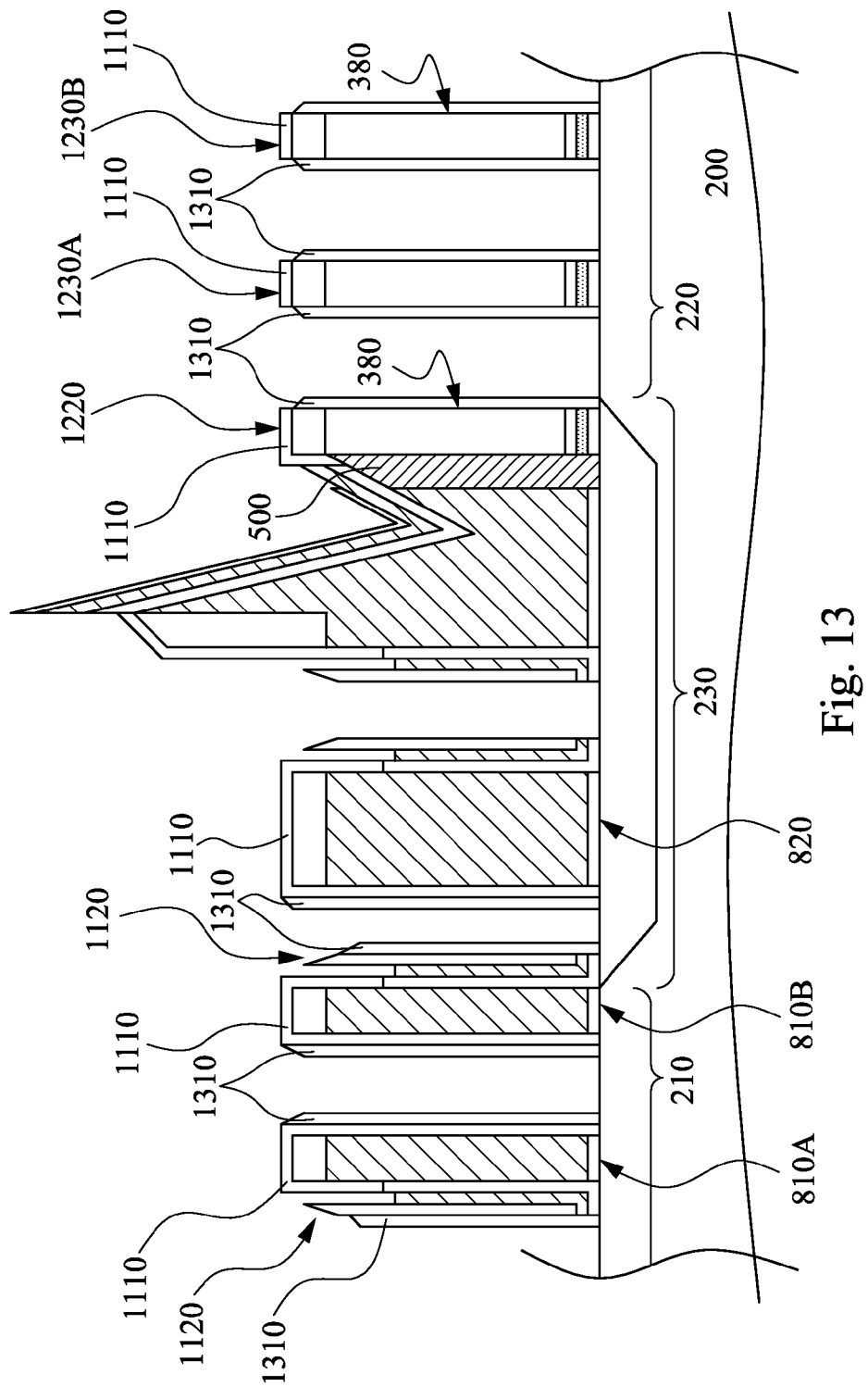

Referring to FIG. 13, a plurality of third spacers 1310 are formed next to the gate stacks 810, 820, 1220, 1230 and the storage stacks 1120 on the substrate 200. The third spacers 1310 include silicon nitride and formed by photolithography, deposition and etching process as previously described. The third spacers 1310 are formed to protect the gate stacks and storage stacks from the following steps.

Figure 14:
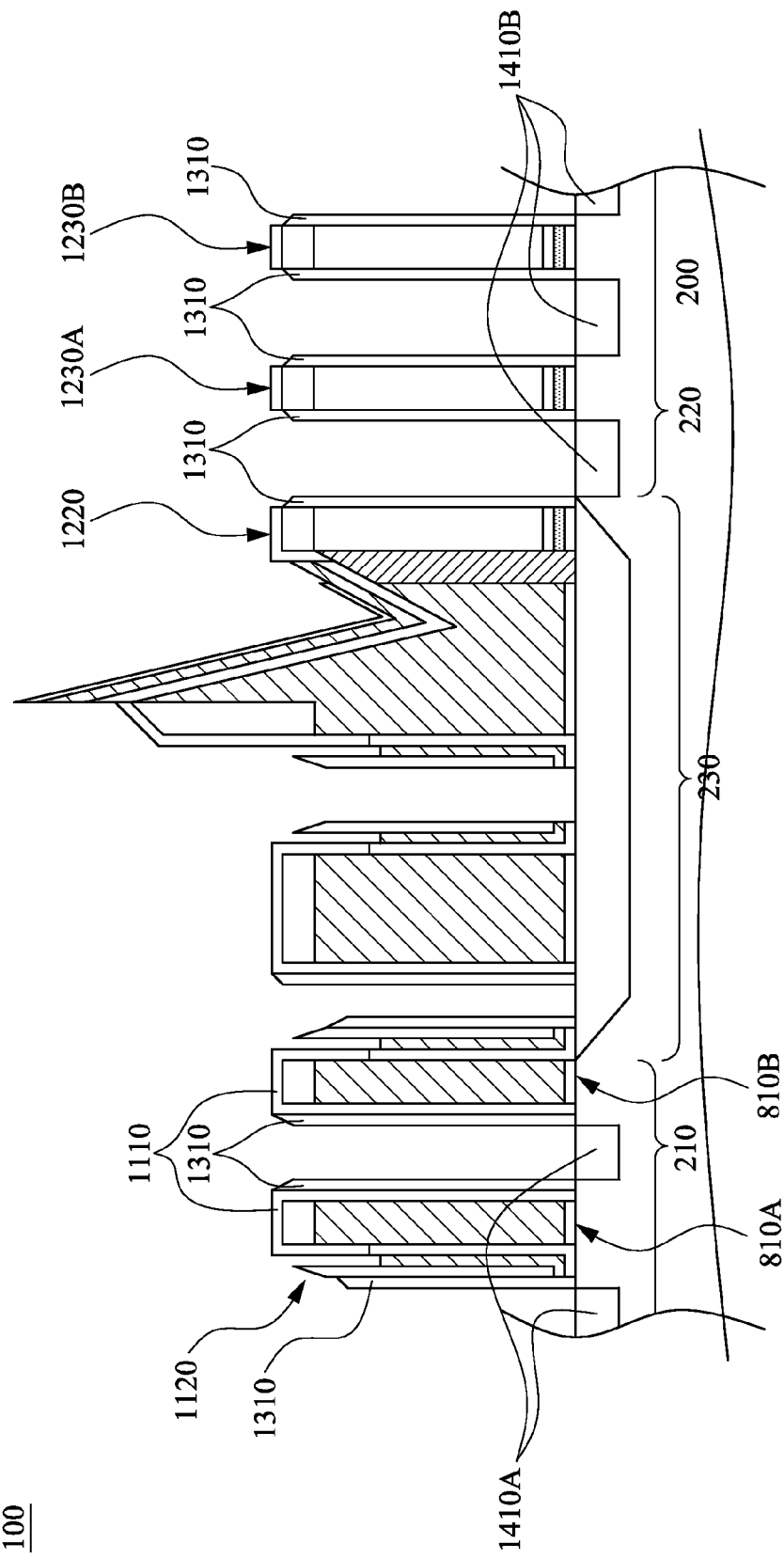

Referring to FIG. 14, a plurality of doped regions 1410 are formed between the third spacers 1310 on the first active region 210 and second active region 220 of the substrate 200. The doped regions 1410 are formed by ion implantation procedure, using arsenic or phosphorous ions for PFET, or boron or $BF_2$ with NFET, followed by a rapid thermal anneal (RTA) or laser anneal (LSA) procedure to activate the source/drain dopants. In various embodiments of present disclosure, a plurality of nickel silicide (NiSi) regions (not illustrated in the figure) are formed on the doped regions 1410 for future contacts to the doped regions 1410.

Figure 15:
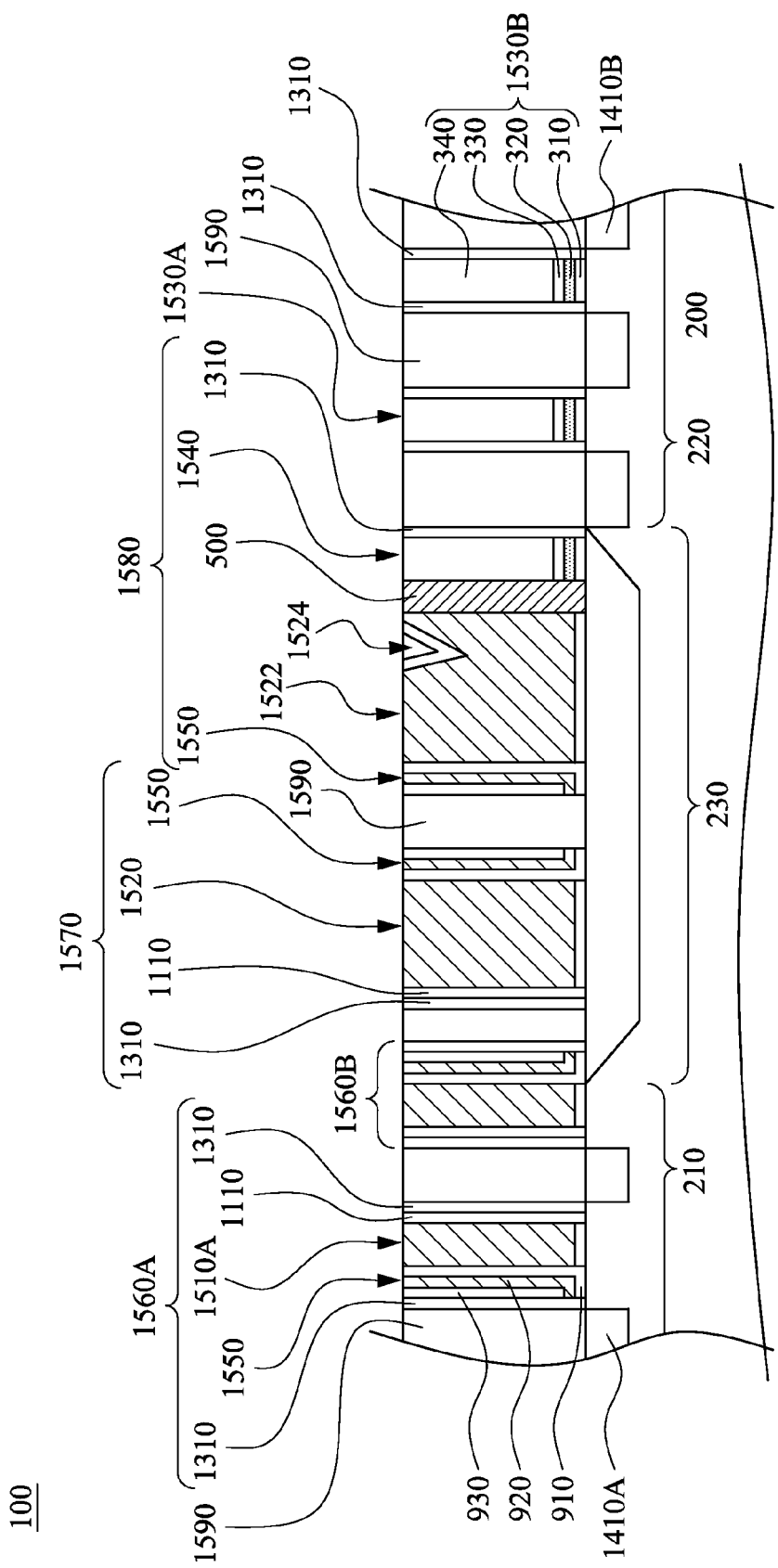

Referring to FIG. 15, the semiconductor device 100 is planarized after a first interlayer dielectric layer 1590 is deposited over the substrate 200. The first interlayer dielectric layer 1590 includes silicon oxide or borophosphosilicate glass (BPSG) and formed by deposition method as LPCVD, PECVD or other suitable methods. In various embodiments of present disclosure, an oxide layer (not illustrated in the figure) is deposited between the first interlayer dielectric layer 1590 and the substrate 200 and between the first interlayer dielectric layer 1590 and the third spacers 1310. In various embodiments of present disclosure, a tensile SiN etch stop layer (not illustrated in the figure) is deposited before the deposition of the first interlayer dielectric layer 1590. The upper surface of the semiconductor device 100 is planarized to expose the conductive layers 340, 620 in gate stacks by a chemical mechanical polishing (CMP) process. After planarize the semiconductor device 100, a first semiconductor structure 1560 on the first active region 210 of the substrate 200, a first dummy structure 1570 and a second dummy structure 1580 on the dummy region 230 of the substrate 200, and a second gate structure 1530 on the second active region 220 of the substrate 200 are formed.

The first dummy structure 1570 includes a first dummy gate stack 1520, a second dielectric layer 1110 at one side of the first dummy gate stack 1520, a storage structure 1550 at the other side of the first dummy gate stack 1520, and a third spacer 1310 next to the second dielectric layer. The first dummy gate stack 1520 includes a second intermediate layer 910 and a second conductive layer 920 over the second intermediate layer 910. The storage structure 1550 is the storage stacks 1120 after planarization.

The second dummy structure 1580 includes a second dummy gate stack 1540 with a high-k dielectric layer 320 and a first spacer 500 next to the second dummy gate stack 1540, a third dummy gate stack 1522 next to the first spacer 500, a storage structure 1550 next to the third dummy gate stack 1522, and a third spacer 1310 next to the second dummy gate stack 1540. The second dummy gate stack 1540 is the fourth gate stack 1220 after planarization, includes a first intermediate layer 310 over the substrate 200, a high-k dielectric layer 320 over the first intermediate layer 310, an etch stop layer 330 over the high-k dielectric layer 320, and a first conductive layer 340 over the etch stop layer 330. The third dummy gate stack 1522 is the residue gate stack 740 after planarization, includes the second intermediate layer 710 overlying the substrate 200, the second conductive layer 720 over the a second intermediate layer 710, comprising the trench 750 on a upper surface of the second conductive layer 720, and a trench stack 1524 filling the trench 750 of the second conductive layer 720 to flat the upper surface of the second conductive layer 720. The trench stack 1524 is the first storage stack 940 left in the trench 750 after planarization, may include the storage layer 910, third conductive layer 920 over the storage layer 910, and the second residue layer 1020 over the third conductive layer 920. The width of the dummy structures 1570,1580 is about 0.2-0.6 µm.

The first semiconductor structure 1560 includes a first gate structure 1510, a storage structure 1550 next to the first gate structure 1510, and a second dielectric layer 1110 on the sidewall at the other side of the first gate structure 1510, two third spacers 1310 next to the storage structure 1550 and the second dielectric layer 1110 separately. The first gate structure 1510 includes the second intermediate layer 610 over the substrate 200, and the second conductive layer 620 over the second intermediate layer 610.

The second gate structure 1530 is the second gate stack 1230 after planarization, includes the first intermediate layer 310 over the substrate 200, the high-k dielectric layer 320 over the first intermediate layer 310, the etch stop layer 330 over the high-k dielectric layer 320, and the first conductive layer 340 over the etch stop layer 330.

Figure 16:
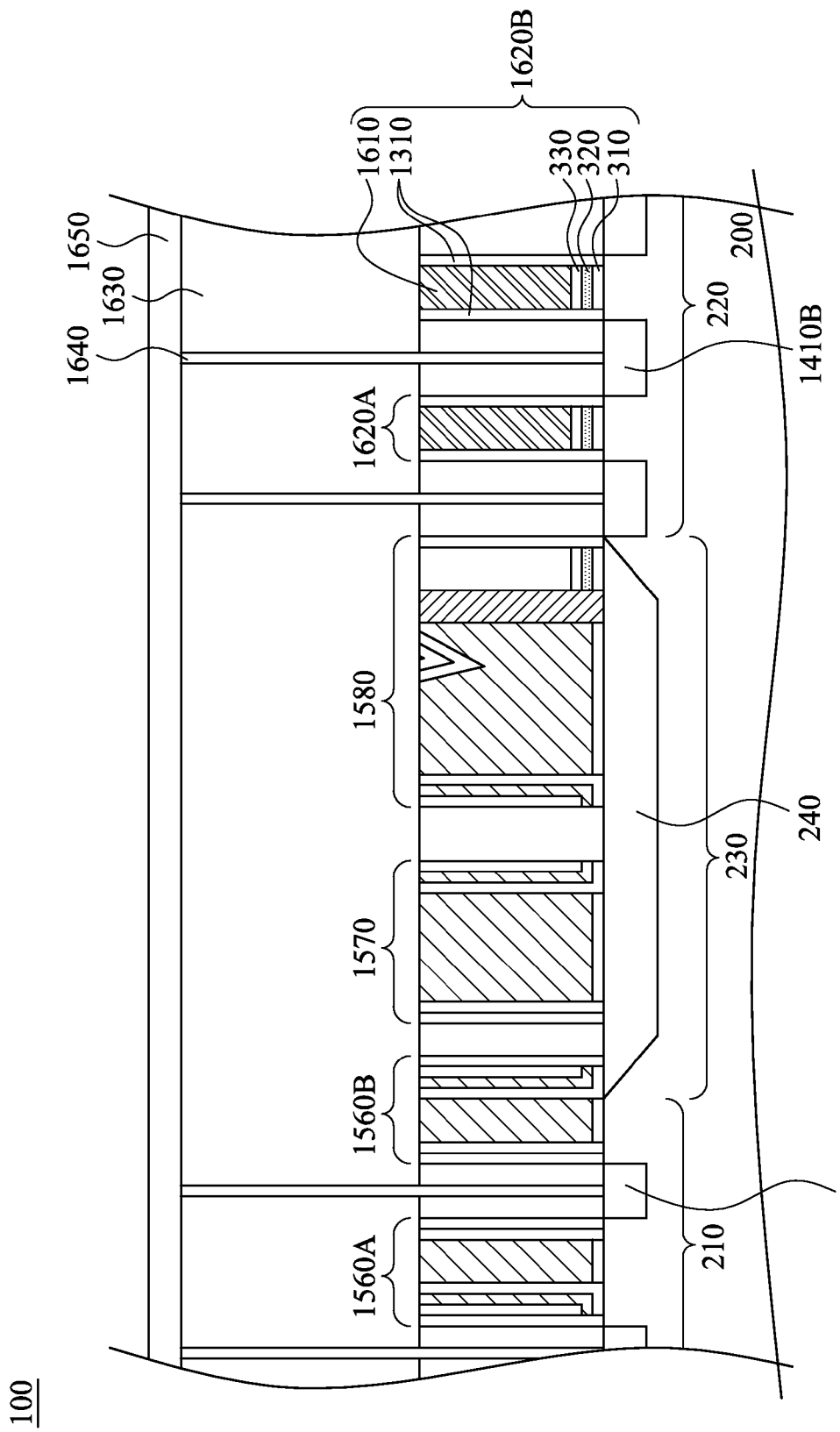

Referring to FIG. 16, FIG. 16 is a cross-sectional view of a semiconductor device 100 according to various embodiments of the present disclosure. A second semiconductor structure 1620 is formed by replacing the first conductive layer 340 in the second gate structure 1530 to a metal gate layer 1610. The replacing process includes photolithography, etching the first conductive layer 340, depositing metal gate layer 1610 and metal CMP. The metal gate layer 1610 includes aluminium, tungsten or other suitable material. The second semiconductor structure 1620 includes a first intermediate layer 310 over the substrate 200, a high-k dielectric layer 320 over the first intermediate layer 310, an etch stop layer 330 over the high-k dielectric layer 320, a metal gate layer 1610 over the etch stop layer 330, and two third spacers 1310 on both sidewalls of the metal gate layer 1610.

After the formation of the second semiconductor structure 1620, a second interlayer dielectric layer 1630 is disposed over the semiconductor device 100, a plurality of contacts 1640 are formed through the interlayer dielectric layers 1630, 1590, and a metal layer 1650 is disposed over the second interlayer dielectric layer 1640. The second interlayer dielectric layer 1630 includes silicon oxide or borophosphosilicate glass (BPSG) and formed by deposition method as LPCVD, PECVD or other suitable methods. The contacts 1640 connect the doped regions 1410 to the metal layer 1650, formed by etching the interlayer dielectric layers 1640,1590 and depositing a contact material like tungsten or cobalt. The metal layer 1650 includes aluminium, tungsten or other suitable material, and is formed by deposition process as LPCVD or PECVD or other suitable methods.

Thus, according to various embodiments of the present disclosure and referring to FIGS. 2-16, a method for fabricating a semiconductor device includes providing a substrate with a first active region, a dummy region, and a second active region which are sequently adjacent to each other; depositing a high-k stack and a first dielectric layer over the substrate; etching away the first dielectric layer and the high-k stack over the first active region and part of the dummy region of the substrate to form a sidewall of the high-k stack on the dummy region next to a boundary of the dummy region and the second active region; forming a first spacer next to the sidewall of the high-k stack over the dummy region; depositing a second intermediate layer on the substrate surface and a conductive gate stack over the second intermediate layer and the first dielectric layer; etching the conductive gate stack and the second intermediate layer on part of the dummy region next to the first spacer to form a residue gate stack and separate the conductive gate stack with the residue gate stack, and etching away the conductive gate stack and the first dielectric layer on the high-k stack; forming a first semiconductor structure on the first active region; and forming a second semiconductor structure on the second active region.

In which depositing a high-k stack and a first dielectric layer over the substrate includes depositing a first intermediate layer over the substrate; depositing a high-k dielectric layer over the first intermediate layer; depositing an etch stop layer over the high-k dielectric layer; depositing a first conductive layer over the etch stop layer; depositing a first protective layer over the first conductive layer; and depositing a first dielectric layer over the first protective layer. Depositing a conductive gate stack over the substrate and the high-k stack includes depositing a second conductive layer over the second intermediate layer and the first dielectric layer; and depositing a second protective layer over the second conductive layer.

In various embodiments of the present disclosure, a method of forming a first semiconductor structure on the first region includes forming a first gate stack on the first active region and a third gate stack on the dummy region; depositing a first storage stack over the gate stacks, the high-k stack, the first spacer, and the substrate; etching part of the first storage stack to form a plurality second spacers next to the stacks; and etching part of the first storage stack to form a plurality of second storage stacks.

In various embodiments of the present disclosure, a method of forming a second semiconductor structure on the second region includes etching the high-k stacks to form a second gate stack on the second active region on the substrate and a fourth gate stack on the dummy region next to the second active region; forming a plurality of third spacers next to the gate stacks and the storage stacks on the substrate; forming a plurality of doped regions between the third spacers on the first active region and second active region of the substrate; depositing a first interlayer dielectric layer over the substrate; planarizing the semiconductor device to expose the conductive layers in gate stacks; forming a high-k metal gate structure by replacing the first conductive layer to a metal gate layer in the second gate structure; depositing a second interlayer dielectric layer over the semiconductor device; forming a plurality of contacts to the doped regions; and depositing a metal layer over the second interlayer dielectric layer.

Figure 17:
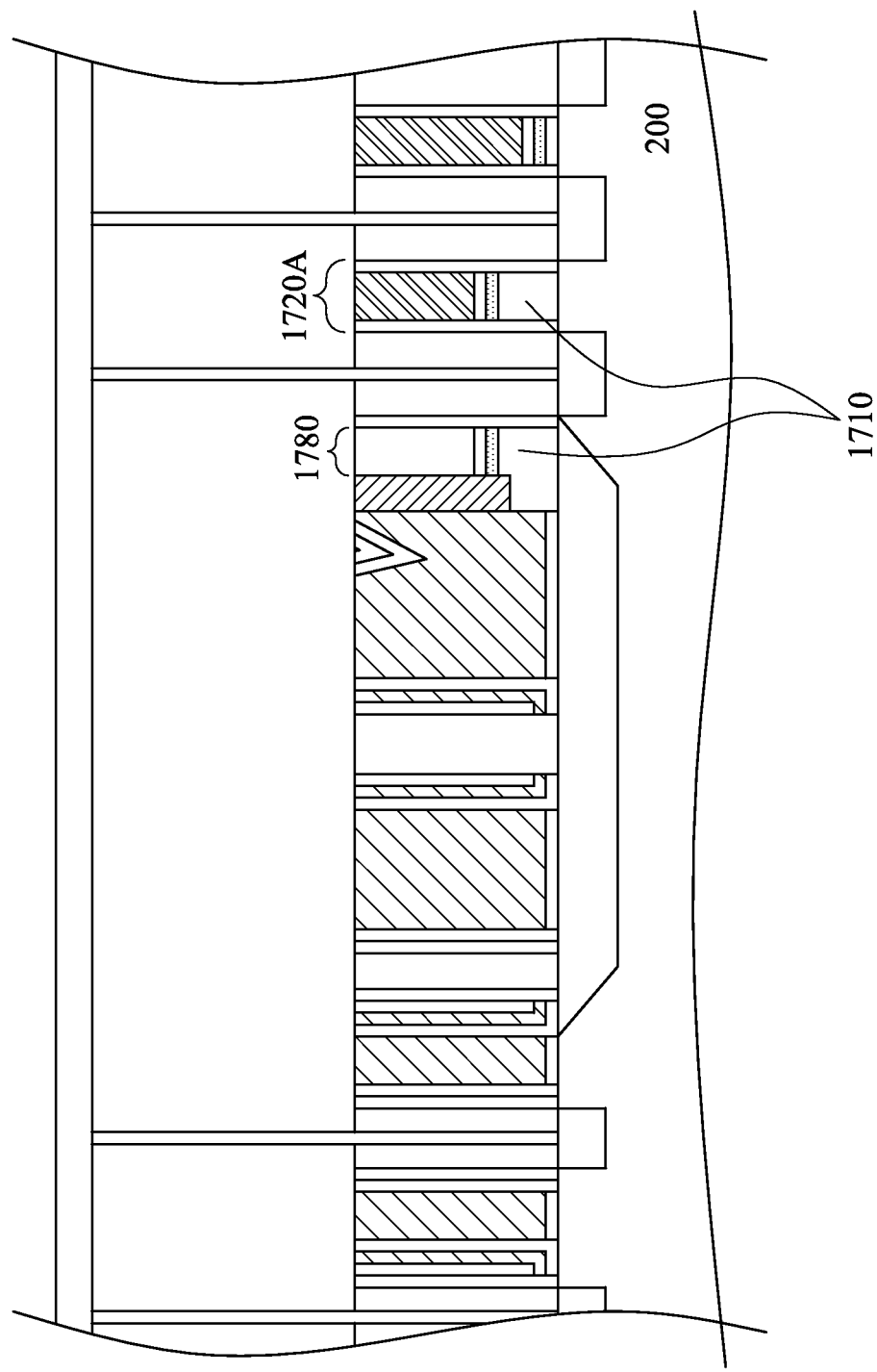
FIG. 17 is a cross-sectional view of a semiconductor device according to one embodiment of the present disclosure.

Referring to FIG. 17, FIG. 17 is a cross-sectional view of a semiconductor device 100 according to another embodiment of the present disclosure. The difference between the semiconductor device 100 illustrated in FIG. 16 is that the first intermediate layer 310 in the second semiconductor structure 1620A and in the second dummy structure 1580 in FIG. 16 is changed for a high voltage oxide layer 1710 includes silicon oxide to form a second high-k metal gate structure 1720A and a fourth dummy gate stack 1780.

The present disclosure includes a semiconductor device and a method of fabricating the semiconductor device. In various embodiments of the present disclosure, the fabricating method is a high-k material first, HKMG device last process. Because the method is a high-k material first process, it can cost down 2 masks of memory process during the fabrication, and has no contamination problem made by the 2 masks. In order to make the high-k to material first, HKMG device last process available, the first spacer is added to protect the first formed high-k stack and to separate the HKMG device and the memory device. Therefore, the semiconductor device fabricating by the method will have two dummy structures, the first dummy structure includes a dummy gate stack including a doped polysilicon conductive layer, and the second dummy structure includes the first spacer and an another doped polysilicon conductive layer. The method can form embedded split gate SiON-MONOS memory structure in HKMG technology for system on chip application.

In various embodiments of the present disclosure, a semiconductor device includes a substrate, a first dummy structure, a second dummy structure, a first semiconductor structure, and a second semiconductor structure. The substrate has a first area and a second area divided by a shallow trench isolation (STI) area. The first dummy structure on the STI area at the side of the first area of the substrate includes a first dummy gate stack. The second dummy structure on the STI area at the side of the second area of the substrate includes a second dummy gate stack with a high-k dielectric layer and a first spacer next to the second dummy gate stack. The first semiconductor structure on the first area of the substrate includes a first gate structure with a second intermediate layer and a second conductive layer over the second intermediate layer. Further, the second semiconductor structure on the second area of the substrate includes a high-k dielectric layer and a metal gate layer over the high-k dielectric layer. In one embodiment of the present disclosure, the semiconductor device can make spilt gate memory embed in HKMG technology.

In various embodiments of the present disclosure, the first and second dummy structure separate the first and second semiconductor structure, the semiconductor structures can be chosen by materials, in which the first semiconductor structure includes non high-k material and poly silicon gate, the second semiconductor structure includes high-k material and metal gate structure, so the first and second semiconductor structures can include memory devices, logic device, lens, sensors, amplifiers, oscillators, light emitting diode or combinations thereof. Or the semiconductor devices can be chosen by functions as the first semiconductor structure is a memory device and the second semiconductor structure is logic device. Therefore, the first semiconductor structure is a memory device can be a DRAM, SRAM, magnetic RAM, NVM, flash memory, thin film split gate flash memory, or combinations thereof, and the second semiconductor structure is a logic device includes pFET, nFET, MOSFET, BJT, PMOS, NMOS, COMS, or combinations thereof.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device comprising:
   a substrate having a first area and a second area divided by a shallow trench isolation (STI) area;

a first dummy structure on the STI area at the side of the first area of the substrate, comprising a first dummy gate stack;

a second dummy structure on the STI area at the side of the second area of the substrate, comprising a second dummy gate stack with a high-k dielectric layer, a first spacer next to the second dummy gate stack, and a third dummy gate stack with a trench stack next to the first spacer;

a first semiconductor structure on the first area of the substrate, comprising a first gate structure with a second intermediate layer and a second conductive layer over the second intermediate layer; and a second semiconductor structure on the second area of the substrate, comprising a high-k dielectric layer and a metal gate layer over the high-k dielectric layer.

2. The device of claim 1, wherein the second dummy structure further comprises:
a storage structure next to the third dummy gate stack; and
a third spacer next to the second dummy gate stack.

3. The device of claim 2, wherein the storage structure comprises:
a storage layer having a L-shape over the substrate;
a third conductive layer having the L-shape over the storage layer; and
a third protective layer over the third conductive layer.

4. The device of claim 1, wherein the third dummy gate stack comprises:
a second intermediate layer over the substrate;
a second conductive layer over the second intermediate layer, comprising a trench on a upper surface of the second conductive layer; and
the trench stack filling the trench of the second conductive layer to flat the upper surface of the second conductive layer.

5. The device of claim 1, wherein the first dummy structure further comprises:
a storage structure next to the first dummy gate stack;
a second dielectric layer next to the other side of first dummy gate stack; and
a third spacer next to the second dielectric layer.

6. The device of claim 5, wherein the storage structure comprises:
a storage layer having a L-shape over the substrate;
a third conductive layer having the L-shape over the storage layer; and
a third protective layer over the third conductive layer.

7. The device of claim 1, wherein the width of the dummy structures are about 0.2-0.6 mm.

8. The device of claim 1, wherein the first semiconductor structure comprises memory devices, lens, sensors, amplifiers, oscillators, light emitting diode or combinations thereof.

9. The device of claim 1, wherein the first semiconductor structure comprises a dynamic random access memory (DRAM), a static random access memory (SRAM), a magnetic RAM, a non-volatile memory, or combinations thereof.

10. The device of claim 1, wherein second semiconductor structure comprises a p-type metal oxide semiconductor (PMOS), a n-type metal oxide semiconductor (NMOS), a complementary metal-oxide-semiconductor (COMS), or combinations thereof.

11. The device of claim 1, wherein the second semiconductor structure further comprises:
a first intermediate layer over the substrate; and
an etch stop layer over the first intermediate layer, wherein the high-k dielectric layer is interposed between the first intermediate layer and the etch stop layer.

12. A semiconductor device comprising:
a substrate having a first area and a second area divided by a shallow trench isolation (STI) area;
a first dummy structure on the STI area at the side of the first area of the substrate, comprising a first dummy gate stack;
a second dummy structure located on the STI area at the side of the second area of the substrate, comprising a second dummy gate stack with a high-k dielectric layer, a first spacer next to the second dummy gate stack, and a third dummy gate structure with a trench stack next to the first spacer;
a memory device on the first area of the substrate; and
a logic device on the second area of the substrate.

13. The device of claim 12, wherein the memory device comprises a thin film split-gate flash memory.

14. The device of claim 13, wherein the logic devices comprises a high-k metal gate structure.

15. The device of claim 12, wherein the second dummy structure further comprises:
a storage structure next to the third dummy gate stack; and
a third spacer next to the second dummy gate stack.

16. The device of claim 12, wherein the third dummy gate stack comprises:
a second intermediate layer over the substrate;
a second conductive layer over the second intermediate layer, comprising a trench on a upper surface of the second conductive layer; and
the trench stack filling the trench of the second conductive layer to flat the upper surface of the second conductive layer.

17. The device of claim 12, wherein the width of the dummy structures are about 0.2-0.6 mm.

18. The device of claim 12, wherein the memory device comprises a dynamic random access memory (DRAM), a static random access memory (SRAM), a magnetic RAM, a non-volatile memory, or combinations thereof.

19. The device of claim 12, wherein the logic device comprises a p-type metal oxide semiconductor (PMOS), a n-type metal oxide semiconductor (NMOS), a complementary metal-oxide-semiconductor (COMS), or combinations thereof.

20. The device of claim 12, wherein the first dummy structure further comprises:
a storage structure next to the first dummy gate stack;
a second dielectric layer next to the other side of first dummy gate stack; and
a third spacer next to the second dielectric layer.

* * * * *